United States Patent
Tay et al.

(10) Patent No.: US 8,643,157 B2
(45) Date of Patent: Feb. 4, 2014

(54) INTEGRATED CIRCUIT PACKAGE SYSTEM HAVING PERIMETER PADDLE

(75) Inventors: Lionel Chien Hui Tay, Singapore (SG); Zigmund Ramirez Camacho, Singapore (SG); Jairus Legaspi Pisigan, Singapore (SG)

(73) Assignee: Stats Chippac Ltd., Singapore (SG)

( * ) Notice: Subject to any disclaimer, the term of this patent is extended or adjusted under 35 U.S.C. 154(b) by 600 days.

(21) Appl. No.: 11/766,771

(22) Filed: Jun. 21, 2007

(65) Prior Publication Data

US 2008/0315380 A1    Dec. 25, 2008

(51) Int. Cl.
*H01L 23/495* (2006.01)

(52) U.S. Cl.
USPC ............... 257/676; 257/666; 257/E21.499; 438/123

(58) Field of Classification Search
USPC .......... 257/723, 780, 777, E21.499, 666–676; 438/106, 123
See application file for complete search history.

(56) References Cited

U.S. PATENT DOCUMENTS

| | | | |
|---|---|---|---|
| 5,012,323 A * | 4/1991 | Farnworth | 257/723 |
| 6,265,763 B1 * | 7/2001 | Jao et al. | 257/676 |
| 6,333,564 B1 * | 12/2001 | Katoh et al. | 257/780 |
| 6,420,783 B2 * | 7/2002 | Wada et al. | 257/724 |
| 6,583,502 B2 | 6/2003 | Lee et al. | |
| 6,700,206 B2 * | 3/2004 | Kinsman | 257/777 |
| 6,703,691 B2 * | 3/2004 | Chen et al. | 257/666 |
| 6,703,713 B1 * | 3/2004 | Tseng et al. | 257/777 |
| 6,818,968 B1 | 11/2004 | Cheah | |
| 6,841,870 B2 * | 1/2005 | Misumi | 257/723 |
| 6,844,615 B1 | 1/2005 | Edwards et al. | |
| 6,946,722 B2 * | 9/2005 | Hinkle et al. | 257/666 |
| 6,955,941 B2 * | 10/2005 | Bolken | 438/106 |
| 2002/0027270 A1 * | 3/2002 | Iwakiri | 257/670 |
| 2006/0081967 A1 * | 4/2006 | Ha et al. | 257/676 |
| 2009/0085181 A1 * | 4/2009 | Advincula, Jr. et al. | 257/676 |

* cited by examiner

*Primary Examiner* — Eugene Lee
*Assistant Examiner* — Fang-Xing Jiang
(74) *Attorney, Agent, or Firm* — Ishimaru & Associates LLP

(57) ABSTRACT

An integrated circuit package system comprising: forming a paddle having a hole and an external interconnect; mounting an integrated circuit device having an active side to the paddle with the active side facing the paddle and the hole; connecting a first internal interconnect between the active side and the external interconnect through the hole; and encapsulating the integrated circuit device, the paddle, the first internal interconnect, and the external interconnect with the external interconnect partially exposed.

6 Claims, 7 Drawing Sheets

INTEGRATED CIRCUIT PACKAGE SYSTEM HAVING PERIMETER PADDLE

TECHNICAL FIELD

The present invention relates generally to an integrated circuit package system, and more particularly to an integrated circuit package system with an encapsulation.

BACKGROUND ART

Modern consumer electronics, such as cellular phones, digital cameras, and music players, are packing more integrated circuits into an ever-shrinking physical space with expectations for decreasing cost. Numerous technologies have been developed to meet these requirements. Some of the research and development strategies focus on new technologies while others focus on improving the existing and mature technologies. Research and development in the existing technologies may take a myriad of different directions.

Consumer electronics requirements demand more integrated circuits in an integrated circuit package while paradoxically providing less physical space in the system for the increased integrated circuits content. Continuous cost reduction is another requirement. Some technologies primarily focus on integrating more functions into each integrated circuit. Other technologies focus on stacking these integrated circuits into a single package. While these approaches provide more functions within an integrated circuit, they do not fully address the requirements for lower height, smaller space, and cost reduction.

One proven way to reduce cost is to use mature package technologies with existing manufacturing methods and equipments. Paradoxically, the reuse of existing manufacturing processes does not typically result in the reduction of package dimensions. Still the demand continues for lower cost, smaller size and more functionality. Continued integration of functions into a single integrated circuit increases the integrated circuit size necessitating a more expensive package or a higher profile package.

To further condense the packaging of individual devices, packages have been developed in which more than one device can be packaged on a package site of a lead frame strip. Each package site on a lead frame strip is a structure that provides mechanical support for the individual IC dice. It also provides one or more layers of interconnect lines that enable the devices to be connected electrically to surrounding circuitry. Various board-on-chip ("BOC") techniques are used to attach different semiconductor die to a printed circuit board ("PCB"). BOC techniques include flip chip attachment, wire bonding, and tape automated bonding ("TAB").

In some cases, multi-chip devices can be fabricated faster and more cheaply than a corresponding single IC chip that incorporates all the same functions. Current multi-chip modules typically consist of a PCB substrate onto which a set of separate IC chip components is directly attached. Such multi-chip modules have been found to increase circuit density and miniaturization, improve signal propagation speed, reduce overall device size and weight, improve performance, and lower costs, all of which are primary goals of the computer industry.

However, such multi-chip modules can be bulky. The area required to mount a die or module on a circuit board determines the IC package density. One method for reducing the board size of multi-chip modules and thereby increase their effective density is to stack the die or chips vertically within the module or package. In one design, a pair of IC die is mounted on opposite sides of a lead frame paddle. Gold or aluminum wires then connect the wire bonding pads on both the upper die and the lower die with the ends of their respective lead frame lead extensions.

Higher integration can be achieved through chip scale package (CSP) applications such as flip chip technology. Flip chip technology can employ area arrays for bump pads including connections to a carrier, thereby reducing package area and shortening transmission paths. A flip chip is generally a semiconductor device, such as an integrated circuit, having bead-like terminals formed on one surface of the chip. The terminals serve to both secure the chip to a circuit board and electrically connect the flip chip's circuitry to a conductor pattern formed on the circuit board, which may be a ceramic substrate, printed wiring board, flexible circuit, a substrate, or a lead frame. The typical flip chip is generally quite small, resulting in the terminals being crowded along the perimeter. As a result, conductor patterns are typically composed of numerous conductors often spaced closely.

Flip chip offers increased I/O density but may not be the best interconnect option for other integrated circuit devices. For example, integrated circuits providing a large number of functions may benefit from the flip chip interface. Other devices may have dense and repetitive functions, such as memory devices, that do not require a flip chip interface and may be more cost effective using wire bonding.

To meet this demand, the integrated circuit packages, such as quad flat nonleaded (QFN) package, are becoming popular owing to its small form factor, good thermal and electrical performance. A combination of the QFN package and flip chip technology would provide an attractive package. However, one problem in the conventional assembly of a flip chip on QFN lead frame is the challenge of integrating various other types of integrated circuits with different interfaces into a single package.

Thus, a need still remains for an integrated circuit package system providing low cost manufacturing, improved yield, improved reliability, and low profile. In view of the ever-increasing need to save costs and improve efficiencies, it is more and more critical that answers be found to these problems.

Solutions to these problems have been long sought but prior developments have not taught or suggested any solutions and, thus, solutions to these problems have long eluded those skilled in the art.

DISCLOSURE OF THE INVENTION

An integrated circuit package system comprising: forming a paddle having a hole and an external interconnect; mounting an integrated circuit device having an active side to the paddle with the active side facing the paddle and the hole; connecting a first internal interconnect between the active side and the external interconnect through the hole; and encapsulating the integrated circuit device, the paddle, the first internal interconnect, and the external interconnect with the external interconnect partially exposed.

Certain embodiments of the invention have other aspects in addition to or in place of those mentioned above. The aspects will become apparent to those skilled in the art from a reading of the following detailed description when taken with reference to the accompanying drawings.

BEST MODE FOR CARRYING OUT THE INVENTION

Figure 1:
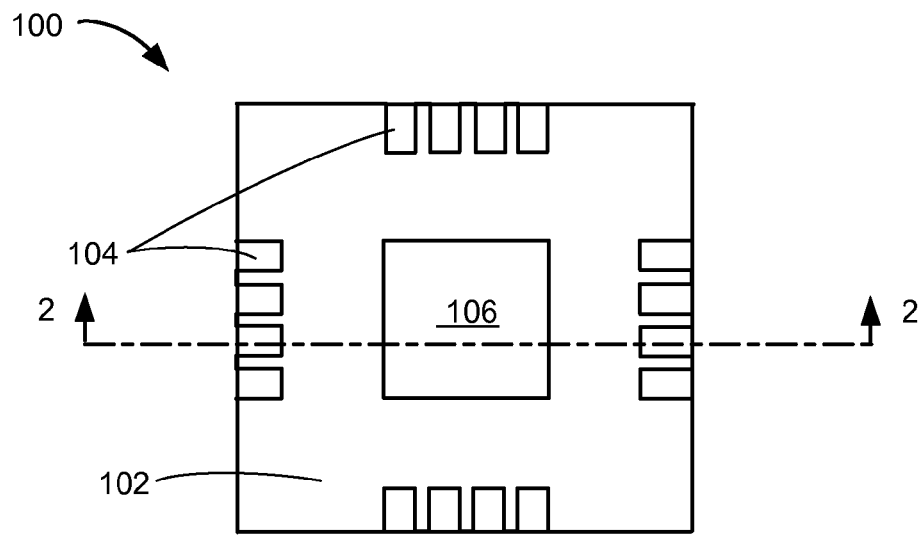
FIG. 1 is a bottom view of an integrated circuit package system in a first embodiment of the present invention.

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail. Likewise, the drawings showing embodiments of the system are semi-diagrammatic and not to scale and, particularly, some of the dimensions are for the clarity of presentation and are shown greatly exaggerated in the drawing FIGS.

In addition, where multiple embodiments are disclosed and described having some features in common, for clarity and ease of illustration, description, and comprehension thereof, similar and like features one to another will ordinarily be described with like reference numerals. The embodiments have been numbered first embodiment, second embodiment, etc. as a matter of descriptive convenience and are not intended to have any other significance or provide limitations for the present invention.

For expository purposes, the term "horizontal" as used herein is defined as a plane parallel to the plane or surface of the integrated circuit, regardless of its orientation. The term "vertical" refers to a direction perpendicular to the horizontal as just defined. Terms, such as "above", "below", "bottom", "top", "side"(as in "sidewall"), "higher", "lower", "upper", "over", and "under", are defined with respect to the horizontal plane. The term "on" means there is direct contact among elements. The term "processing" as used herein includes deposition of material, patterning, exposure, development, etching, cleaning, molding, and/or removal of the material or as required in forming a described structure. The term "system" as used herein means and refers to the method and to the apparatus of the present invention in accordance with the context in which the term is used. The terms "paddle" and "external interconnects" as used herein means and refers to elements of a lead frame. As used herein, the term "integrated circuit device" may refer to an integrated circuit die or a packaged integrated circuit.

Referring now to FIG. 1, therein is shown a bottom view of an integrated circuit package system 100 in a first embodiment of the present invention. The bottom view shows a first encapsulation 102, such as an epoxy molding compound, preferably surrounding and exposing a row of external interconnects 104, such as leads, and an integrated circuit device 106.

For illustrative purposes, the external interconnects 104 are shown in a single row configuration, although it is understood that the external interconnects 104 may be in a different configuration, such as multiple rows. Also for illustrative purposes, a package side of the integrated circuit package system 100 has the external interconnects 104 equally spaced, although it is understood that the integrated circuit package system 100 may have some sites depopulated such that the package side might not have the external interconnects 104 equally spaced.

Figure 2:
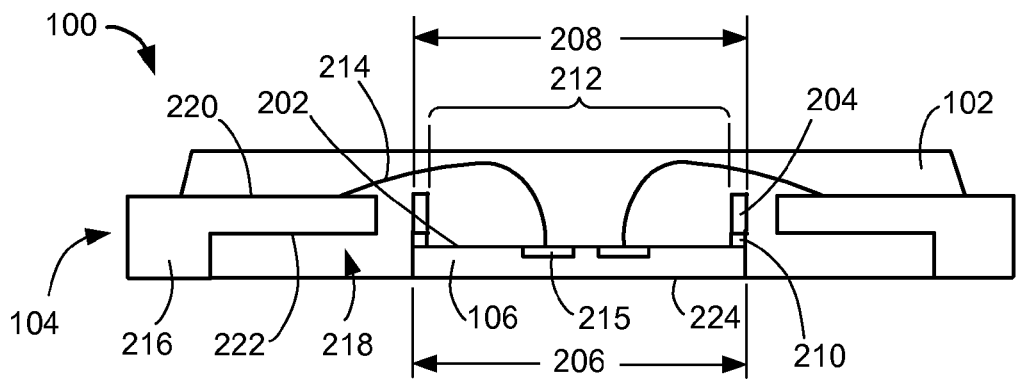
FIG. 2 is a cross-sectional view of the integrated circuit package system along line 2-2 of FIG. 1.

Referring now to FIG. 2, therein is shown a cross-sectional view of the integrated circuit package system 100 along line 2-2 of FIG. 1. The cross-sectional view depicts the integrated circuit device 106 having an active side 202 mounted under a paddle 204, such as a perimeter die-attach paddle, with the active side 202 facing the paddle 204. A device dimension 206, such as a device width, of the integrated circuit device 106 is preferably large enough to be mounted under the paddle 204 or greater than a paddle dimension 208, such as a paddle width. The active side 202 may be mounted to the paddle 204 with an adhesive 210, such as a die-attach adhesive in a bump or column configuration.

The paddle 204 preferably includes a hole 212 located centrally in the paddle 204. First internal interconnects 214, such as bond wires, ribbon bond wires, or reverse stand-off stitch bonds (RSSB), connect device pads 215, such as bond pads, on the active side 202 and the external interconnects 104 through the hole 212. As discussed later herein, the hole 212 preferably is centrally located in the paddle 204 and may be in a variety of geometric configuration, such as a shape of a circle, a square, a rectangle, or a hexagon, for example.

Each of the external interconnects 104 includes a body 216 and a tip 218, wherein the tip 218 includes a first tip side 220 and a second tip side 222 on an opposing side to the first tip side 220. Preferably, the tip 218 and the paddle 204 are elevated above the body 216. The first tip side 220 may be coplanar with the paddle 204.

The first encapsulation 102, such as an epoxy molding compound, covers the integrated circuit device 106, the first internal interconnects 214, the paddle 204, and the external interconnects 104, with the external interconnects 104 partially exposed. An inactive side 224 on an opposing side of the active side 202 of the integrated circuit device 106 may also be exposed by the first encapsulation 102, although it is understood that the first encapsulation 102 may also cover the inactive side 224.

Also, although the integrated circuit device 106 is shown mounted under the paddle 204 and electrically connected to the external interconnects 104 through the hole 212, it is understood that the integrated circuit device 106 may be mounted over the paddle 204 and electrically connected to the external interconnects 104 through the hole 212. It is also understood that although the active side 202 is shown electrically connected to the external interconnects 104 through the hole 212, the active side 202 may also be connected to the external interconnects 104 without the first internal interconnects 214 passing through the hole 212 in the case where the device dimension 206 is greater than the paddle dimension 208.

It has been discovered that the present invention provides an integrated circuit package system with reduced profile by mounting an active side of an integrated circuit device, such as a an integrated circuit die, facing the paddle having a hole. The internal interconnects, such as wires, electrically connect the integrated circuit device to the external interconnects through the hole in the paddle thereby minimizing the height of the internal interconnects above the paddle and thereby also minimizing the total package height. The routing of internal interconnects preferably through a hole of the paddle accommodates integrated circuit dice having centrally located bond pads, as well as bond pads on the periphery of the device. Moreover, the risk of inadvertent shorts is reduced from the wires in wire loop sweep during the molding process resulting in improved yield and lower cost.

It has also been discovered that the present invention maximizes or increases routing of additional wires to electrically connect central portions of the integrated circuit device by having a hole in the die-attach paddle.

Figure 3:
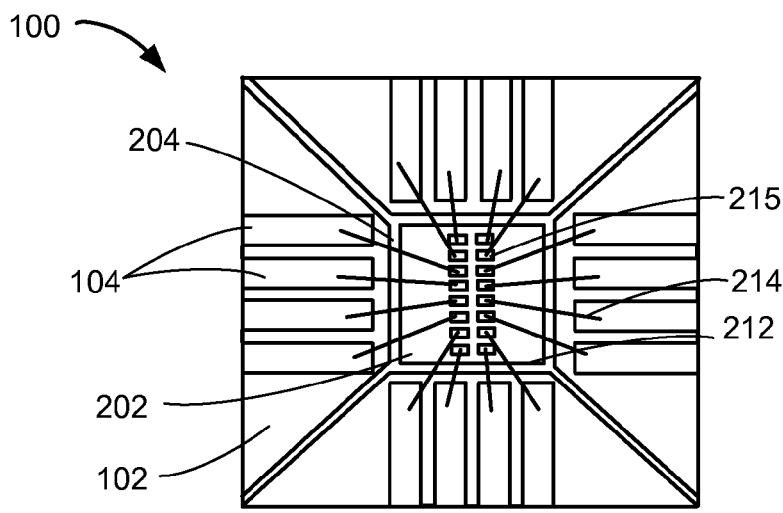
FIG. 3 is a plan view of the integrated circuit package system of FIG. 1.

Referring now to FIG. 3, therein is shown a plan view of the integrated circuit package system 100 of FIG. 1. The plan view depicts the integrated circuit package system 100 without the top portion of the first encapsulation 102 of FIG. 1 to show the active side 202, the paddle 204, the external interconnects 104, and the first internal interconnects 214. As shown, the first internal interconnects 214 connect the device pads 215 on the active side 202 to the external interconnects 104 through the hole 212 of the paddle 204.

For clarity, a portion of the first internal interconnects 214 are shown connecting the active side 202 and the external interconnects 104. It is understood that the portion of the first internal interconnects 214 does not necessarily represent the full number of the first internal interconnects 214 in the integrated circuit package system 100.

Figure 4:
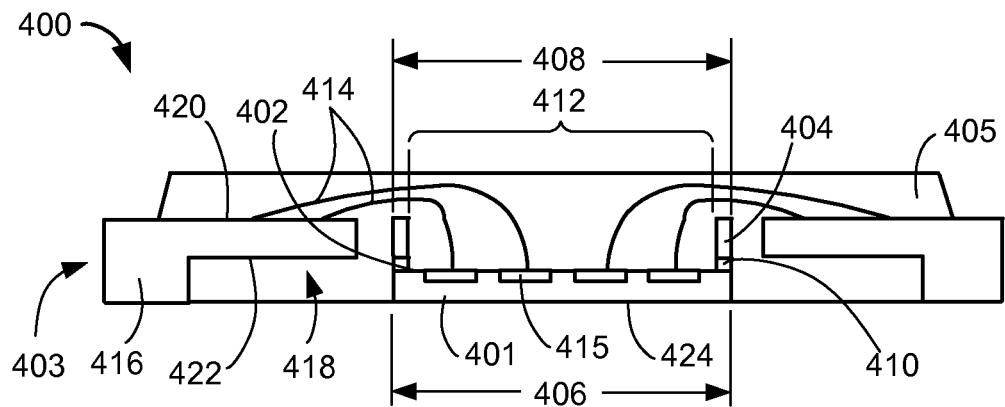
FIG. 4 is a cross-sectional view of an integrated circuit package system along line 2-2 of the bottom view as exemplified by FIG. 1 in a second embodiment of the present invention.

Referring now to FIG. 4, therein is shown a cross-sectional view of an integrated circuit package system 400 along line 2-2 of the bottom view as exemplified by FIG. 1 in a second embodiment of the present invention. The cross-sectional view depicts an integrated circuit device 401 having an array of device pads 415, such as bond pads, on an active side 402 mounted under a paddle 404, such as a perimeter die-attach paddle, with the active side 402 facing the paddle 404. A device dimension 406, such as a device width, of the integrated circuit device 401 is preferably large enough to be mounted under the paddle 404 or greater than a paddle dimension 408, such as a paddle width. The active side 402 may be mounted to the paddle 404 with an adhesive 410, such as a die-attach adhesive in a bump or column configuration.

The paddle 404 preferably includes a hole 412 located centrally in the paddle 404. First internal interconnects 414, such as bond wires, ribbon bond wires, or reverse stand-off stitch bonds (RSSB), connect the active side 402 and external interconnects 403, such as leads, through the hole 412. As discussed later herein, the hole 412 preferably is centrally located in the paddle 404 and may be in a variety of geometric configuration, such as a shape of a circle, a square, a rectangle, or a hexagon, for example.

The array of device pads 415 electrically connects through the hole 412 to the external interconnects 403 with the first internal interconnects 414. The external interconnects 403 each includes a body 416 and a tip 418, wherein the tip 418 includes a first tip side 420 and a second tip side 422 on an opposing side to the first tip side 420. Preferably, the tip 418 and the paddle 404 are elevated above the body 416. The first tip side 420 may be coplanar with the paddle 404.

A first encapsulation 405, such as an epoxy molding compound, covers the integrated circuit device 401, the first internal interconnects 414, the paddle 404, and the external interconnects 403, with the external interconnects 403 partially exposed. An inactive side 424 on an opposing side of the active side 402 of the integrated circuit device 401 may also be exposed by the first encapsulation 405, although it is understood that the first encapsulation 405 may also cover the inactive side 424.

Also, although the integrated circuit device 401 is shown mounted under the paddle 404 and electrically connected to the external interconnects 403 through the hole 412, it is understood that the integrated circuit device 401 may be mounted over the paddle 404 and electrically connected to the external interconnects 403 through the hole 412. It is also understood that although the active side 402 is shown electrically connected to the external interconnects 403 through the hole 412, the active side 402 may also be connected to the external interconnects 403 without the first internal interconnects 414 passing through the hole 412 in the case where the device dimension 406 is greater than the paddle dimension 408.

It has been discovered that the present invention provides an integrated circuit package system with reduced profile and high connectivity by mounting an active side of an integrated circuit device, such as a an integrated circuit die, facing the paddle having a hole and connecting the integrated circuit device having an array of bond pads through the hole. The internal interconnects, such as wires, electrically connect the integrated circuit device to the external interconnects through the hole in the paddle thereby minimizing the wire height above the paddle and thereby also minimizing the total package height. The routing of internal interconnects preferably through a hole of the paddle accommodates integrated circuit dice having centrally located bond pads, as well as bond pads on the periphery of the device. The loop height may be varied for wires connecting to the peripheral bond pads or to inner or non-peripheral bond pads mitigating or eliminating inadvertent shorting. Moreover, the risk of inadvertent shorts is reduced from the wires in wire loop sweep during the molding process resulting in improved yield and lower cost.

It has also been discovered that the present invention maximizes or increases routing of additional wires to electrically connect peripheral and central portions of the integrated circuit device by having a hole in the die-attach paddle.

Figure 5:
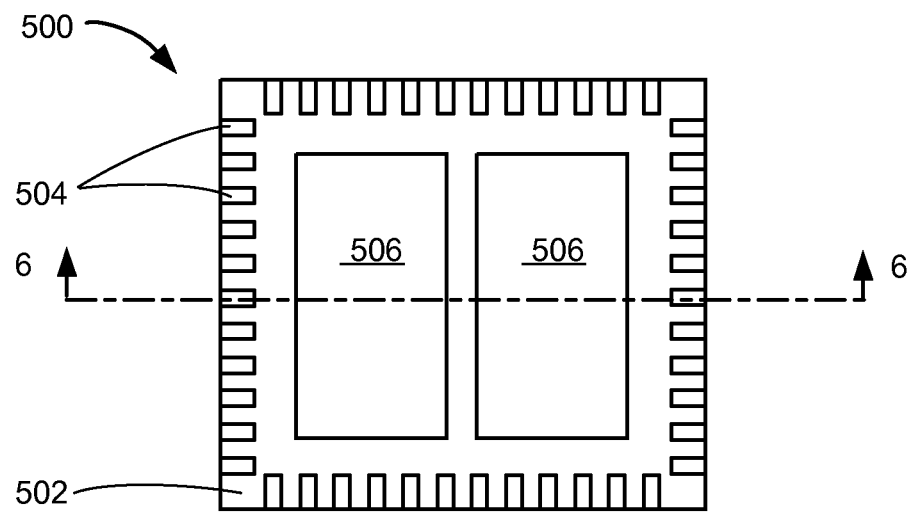
FIG. 5 is a bottom view of an integrated circuit package system in a third embodiment of the present invention.

Referring now to FIG. 5, therein is shown a bottom view of an integrated circuit package system 500 in a third embodiment of the present invention. The bottom view shows a first encapsulation 502, such as an epoxy molding compound, preferably surrounding and exposing a row of external interconnects 504, such as leads, and integrated circuit devices 506.

For illustrative purposes, the integrated circuit devices 506 are shown as substantially the same size to each other, although it is understood that the integrated circuit devices 506 may be different from each other, such as different sizes, types, or functions. Also for illustrative purposes, the integrated circuit package system 500 is shown with two of the integrated circuit devices 506, although it is understood that the integrated circuit package system 500 may have a different number of the integrated circuit devices 506, such as three or four. Further for illustrative purposes, the external interconnects 504 are shown in a single row configuration, although it is understood that the external interconnects 504 may be in a different configuration, such as multiple rows.

Figure 6:
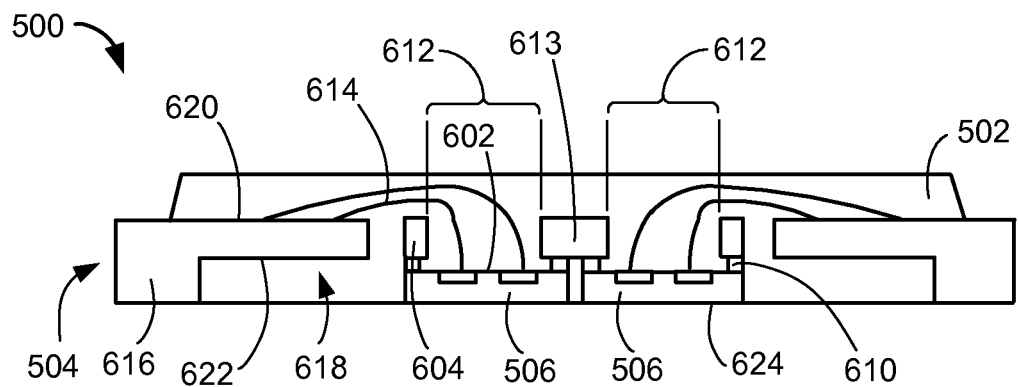
FIG. 6 is a cross-sectional view of the integrated circuit package system along line 6-6 of FIG. 5.

Referring now to FIG. 6, therein is shown a cross-sectional view of the integrated circuit package system 500 along line 6-6 of the bottom view as exemplified by FIG. 5 in a third embodiment of the present invention. The cross-sectional view depicts the integrated circuit devices 506, each having an active side 602 and each mounted under a paddle 604 with the active side 602 facing the paddle 604. The active side 602 may be mounted to the paddle 604 with an adhesive 610, such as a die-attach adhesive in a bump or column configuration.

The paddle 604 preferably provides holes 612 located within an interior portion of the paddle 604. A cross bar 613 of the paddle 604 separates the holes 612 from each other. Each of the integrated circuit devices 506 are preferably under one of the holes 612 and mounted to a peripheral portion of the paddle 604 and the cross bar 613. The active side 602 preferably faces the holes 612.

First internal interconnects 614, such as bond wires, ribbon bond wires, or reverse stand-off stitch bonds (RSSB), preferably connect the active side 602 of each of the integrated circuit devices 506 and the external interconnects 504, such as leads, through one of the holes 612. The integrated circuit devices 506 are spaced away from the external interconnects 504 and are mounted only on the paddle 604. As discussed later herein, the active side 602 is mounted facing the paddle 604 under one of the holes 612. The holes 612 may be in a variety of geometric configuration, such as a shape of a circle, a square, a rectangle, or a hexagon, for example. The holes 612 need not be similarly sized or shaped to each other.

Each of the external interconnects 504 includes a body 616 and a tip 618, wherein the tip 618 includes a first tip side 620 and a second tip side 622 on an opposing side to the first tip side 620. Preferably, the tip 618 and the paddle 604 are elevated above the body 616. The first tip side 620 may be coplanar with the paddle 604. The external interconnects 504 Can be formed adjacent to the paddle 604.

The first encapsulation 502, such as an epoxy molding compound, covers the integrated circuit devices 506, the first internal interconnects 614, the paddle 604, and the external interconnects 504 with the external interconnects 504 partially exposed. An inactive side 624 on an opposing side of the active side 602 of each of the integrated circuit devices 506 may also be exposed by the first encapsulation 502, although it is understood that the first encapsulation 502 may also cover the inactive side 624.

For illustrative purposes, the integrated circuit package system 500 is shown having the cross bar 613 in the paddle 604, although it is understood that the integrated circuit package system 500 may have more than one of the cross bar 613 in the paddle 604. Moreover, the one or more of the crossbar 613 may separate and form the holes 612, Such as a first hole and a second hole, into relatively similar or dissimilar sizes and shapes. Also, although the integrated circuit devices 506 are shown mounted under the paddle 604 and electrically connected to the external interconnects 504 through the holes 612, it is understood that the integrated circuit devices 506 may be mounted over the paddle 604 and electrically connected to the external interconnects 504 through the holes 612.

It is also understood that although the active side 602 is shown electrically connected to the external interconnects 504 through the holes 612, the active side 602 may also be connected to the external interconnects 504 without the first internal interconnects 614 passing through the holes 612. Moreover, although two of the integrated circuit devices 506 are shown herein mounted facing the paddle 604, it is contemplated that the paddle 604 may be designed to accommodate another number of the integrated circuit devices 506 with preferably one of the holes 612 defined by the cross bar 613 for each of the integrated circuit devices 506 to be mounted to the paddle 604.

It has been discovered that the present invention provides an integrated circuit package system with reduced profile by mounting an active side of multiple integrated circuit devices, such as a an integrated circuit die, facing the paddle having holes and a cross bar. The internal interconnects, such as wires, electrically connect the integrated circuit devices to the external interconnects through the holes in the paddle thereby minimizing the wire height above the paddle and thereby also minimizing the total package height while providing a multichip package system. The routing of internal interconnects preferably through holes of the paddle accommodates integrated circuit dice having interior bond pads, as well as bond pads on the periphery of the device. Moreover, the risk of inadvertent shorts is reduced from the wires in wire loop sweep during the molding process resulting in improved yield and lower cost.

It has also been discovered that the present invention maximizes or increases routing of additional wires to electrically connect the integrated circuit devices by having holes and a cross bar in the die-attach paddle.

Figure 7:
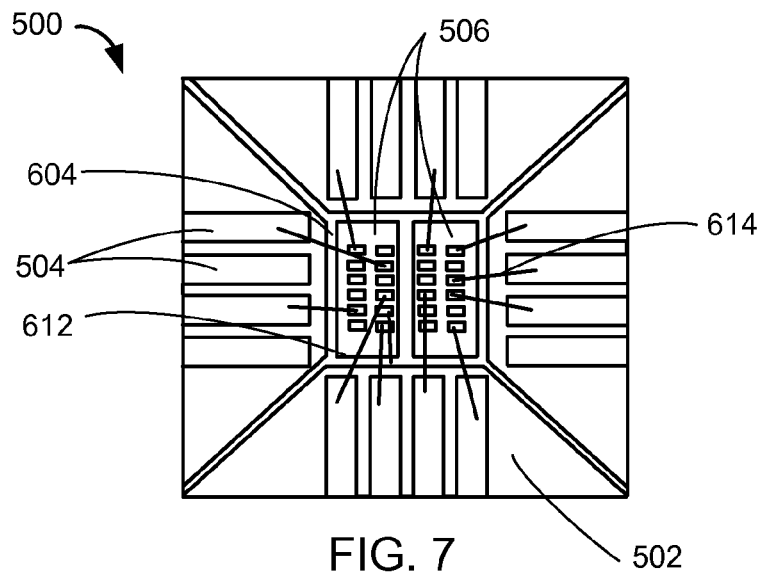
FIG. 7 is a plan view of the integrated circuit package system of FIG. 5.

Referring now to FIG. 7, therein is shown a plan view of the integrated circuit package system 500 of FIG. 5. The plan view depicts the integrated circuit package system 500 without the top portion of the first encapsulation 502 of FIG. 5 to show the integrated circuit devices 506, the paddle 604, the external interconnects 504, and the first internal interconnects 614. As shown, the first internal interconnects 614 connect the integrated circuit devices 506 to the external interconnects 504 through the holes 612 of the paddle 604.

For clarity, a portion of the first internal interconnects 614 are shown connecting the integrated circuit devices 506 and the external interconnects 504. It is understood that the portion of the first internal interconnects 614 does not necessarily represent the full number of the first internal interconnects 614 in the integrated circuit package system 500.

Figure 8:
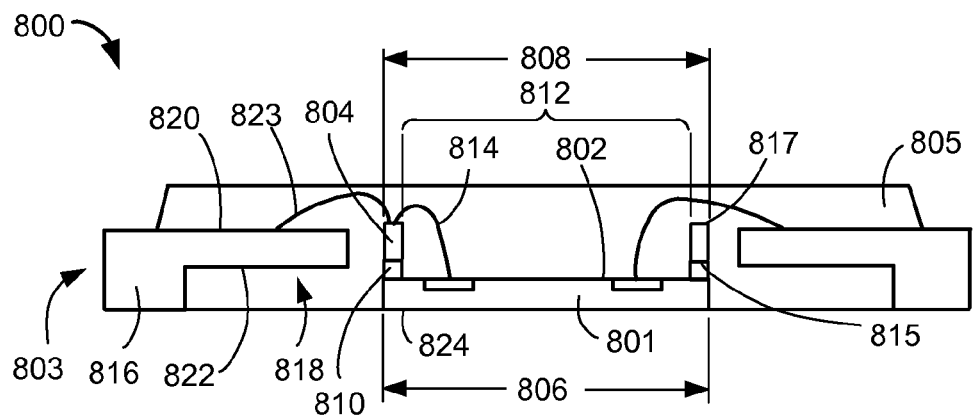
FIG. 8 is a cross-sectional view of an integrated circuit package system along line 2-2 of the bottom view as exemplified by FIG. 1 in a fourth embodiment of the present invention.

Referring now to FIG. 8, therein is shown a cross-sectional view of an integrated circuit package system 800 along line 2-2 of the bottom view as exemplified by FIG. 1 in a fourth embodiment of the present invention. The cross-sectional view depicts an integrated circuit device 801 having an active side 802 mounted under a paddle 804, such as a perimeter die-attach paddle, with the active side 802 facing the paddle 804. A device dimension 806, such as a device width, of the integrated circuit device 801 is preferably large enough to be mounted under the paddle 804 or greater than a paddle dimension 808, such as a paddle width. The active side 802 may be mounted to the paddle 804 with an adhesive 810, such as a die-attach adhesive in a bump or column configuration.

The paddle 804 preferably includes a hole 812 located centrally in the paddle 804. First internal interconnects 814, such as bond wires, ribbon bond wires, or reverse stand-off stitch bonds (RSSB), connect the active side 802 and external interconnects 803, such as leads, through the hole 812. As discussed later herein, the hole 812 preferably is centrally located in the paddle 804 and may be in a variety of geometric configuration, such as a shape of a circle, a square, a rectangle, or a hexagon, for example.

The paddle 804 includes a first paddle side 815 and a second paddle side 817 on an opposing side to the first paddle side 815. The active side 802 is preferably mounted facing the first paddle side 815. Although the integrated circuit device 801 is shown here as mounted to the first paddle side 815, it is understood that the integrated circuit device 801 may also be mounted to with the active side 802 facing the second paddle side 817. The active side 802 of the integrated circuit device 801 electrically connects through the hole 812 to the external interconnects 803 with the first internal interconnects 814.

Preferably, the first internal interconnects 814 may also be used to electrically connect the active side 802 to the second paddle side 817. Each of the external interconnects 803 includes a body 816 and a tip 818, wherein the tip 818 includes a first tip side 820 and a second tip side 822 on an opposing side to the first tip side 820. Preferably, the tip 818 and the paddle 804 are elevated above the body 816. The first tip side 820 may be coplanar with the second paddle side 817. Second internal interconnects 823, such as bond wires, ribbon bond wires, or reverse stand-off stitch bonds (RSSB), electrically connect the second paddle side 817 to the first tip side 820. This configuration may provide signal distribution, such as grounding access for electrical connections. The paddle 804 may function as a reference structure, such as a ground ring or voltage ring.

A first encapsulation 805, such as an epoxy molding compound, covers the integrated circuit device 801, the first internal interconnects 814, the paddle 804, and the external interconnects 803, with the external interconnects 803 partially exposed. An inactive side 824 on an opposing side of the active side 802 of the integrated circuit device 801 may also be exposed by the first encapsulation 805, although it is understood that the first encapsulation 805 may also cover the inactive side 824.

Also, although the integrated circuit device 801 is shown mounted under the paddle 804 and electrically connected to the external interconnects 803 through the hole 812, it is understood that the integrated circuit device 801 may be mounted over the paddle 804 and electrically connected to the external interconnects 803 through the hole 812. It is also understood that although the active side 802 is shown electrically connected to the external interconnects 803 through the hole 812, the active side 802 may also be connected to the external interconnects 803 without the first internal interconnects 814 passing through the hole 812.

It has been discovered that the present invention provides an integrated circuit package system with reduced profile by mounting an active side of an integrated circuit device, such as a an integrated circuit die, facing the paddle over the hole in the paddle and by connecting the paddle to a reference, such as a ground or voltage reference. The internal interconnects, such as wires, electrically connect the integrated circuit device to the external interconnects through the hole in the paddle thereby minimizing the wire height above the paddle and thereby also minimizing the total package height. The routing of internal interconnects preferably through a hole of the paddle accommodates integrated circuit dice having peripherally located bond pads. The additional connection option to the paddle decreases the number of wires with higher loops reducing the package height and mitigating or eliminating inadvertent shorting between wires. Moreover, the risk of inadvertent shorts is reduced from the wires in wire loop sweep during the molding process resulting in improved yield and lower cost.

It has also been discovered that the present invention maximizes or increases routing of additional wires to electrically connect the integrated circuit device by having a hole in the die-attach paddle and utilizing the paddle as a reference ring.

Figure 9:
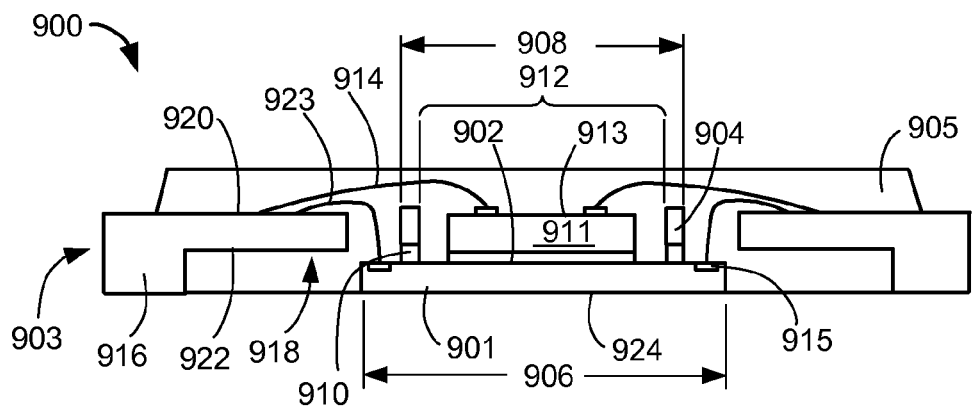
FIG. 9 is a cross-sectional view of an integrated circuit package system along line 2-2 of the bottom view as exemplified by FIG. 1 in a fifth embodiment of the present invention.

Referring now to FIG. 9, therein is shown a cross-sectional view of an integrated circuit package system 900 along line 2-2 of the bottom view as exemplified by FIG. 1 in a fifth embodiment of the present invention. The cross-sectional view depicts a first integrated circuit device 901 having a first active side 902 mounted under a paddle 904, such as a perimeter die-attach paddle, with the first active side 902 facing the paddle 904. A device dimension 906, such as a device width, of the first integrated circuit device 901 is preferably greater than a paddle dimension 908, such as a paddle width. The first active side 902 may be mounted to the paddle 904 with an adhesive 910, such as a die-attach adhesive in a bump or column configuration. A second integrated circuit device 911, such as an integrated circuit die, may also be mounted over the first integrated circuit device 901 for a stack configuration of multiple integrated circuit devices.

The paddle 904 preferably includes a hole 912 located centrally in the paddle 904, wherein the second integrated circuit device 911 is preferably mounted within the hole 912. First internal interconnects 914, such as bond wires, ribbon bond wires, or reverse stand-off stitch bonds (RSSB), connect a second active side 913 of the second integrated circuit device 911 and external interconnect 903, such as leads, through the hole 912. As discussed later herein, the hole 912 preferably is centrally located in the paddle 904 and may be in a variety of geometric configuration, such as a shape of a circle, a square, a rectangle, or a hexagon, for example.

Additionally, to accommodate peripheral device pads 915, such as bond pads, on the first active side 902 that extends beyond the paddle 904, second internal interconnects 923, such as bond wires, ribbon bond wires, or reverse stand-off stitch bonds (RSSB), may preferably connect the peripheral device pads 915 to the external interconnects 903. Each of the external interconnects 903 includes a body 916 and a tip 918, wherein the tip 918 includes a first tip side 920 and a second tip side 922 on an opposing side to the first tip side 920. Preferably, the tip 918 and the paddle 904 are elevated above the body 916. The first tip side 920 may be coplanar with the paddle 904.

A first encapsulation 905, such as an epoxy molding compound, covers the first integrated circuit device 901, the second integrated circuit device 911, the first internal interconnects 914, the second internal interconnects 923, the paddle 904, and the external interconnects 903, with the external interconnects 903 partially exposed. A first inactive side 924 on an opposing side of the first active side 902 of the first integrated circuit device 901 may also be exposed by the first encapsulation 905, although it is understood that the first encapsulation 905 may also cover the first inactive side 924.

Also, although the first integrated circuit device 901 is shown mounted under the paddle 904 and electrically connected to the external interconnects 903 it is understood that the first integrated circuit device 901 may be mounted over the paddle 904 and electrically connected to the external interconnects 903. It is also understood that although the first active side 902 is shown electrically connected to the external interconnects 903 not through the hole 912, the first active side 902 may also be connected to the external interconnects 903 with the second internal interconnects 923 passing through the hole 912.

It has been discovered that the present invention provides an integrated circuit package system with reduced profile by mounting an active side of an integrated circuit device, such as a an integrated circuit die, facing the paddle over the hole in the paddle. The internal interconnects, such as wires, electrically connect the integrated circuit device to the external interconnects through the hole in the paddle thereby minimizing the wire height above the paddle and thereby also minimizing the total package height. The routing of internal interconnects preferably through a hole and outside the paddle accommodates integrated circuit dice having centrally located bond pads, as well as bond pads on the periphery of the device, respectively. Moreover, the risk of inadvertent shorts is reduced from the wires in wire loop sweep during the molding process resulting in improved yield and lower cost.

It has also been discovered that the present invention maximizes or increases routing of additional wires to electrically connect central portions of the integrated circuit device by having a hole in the die-attach paddle as well as connecting to the integrated circuit device outside the paddle.

Figure 10:
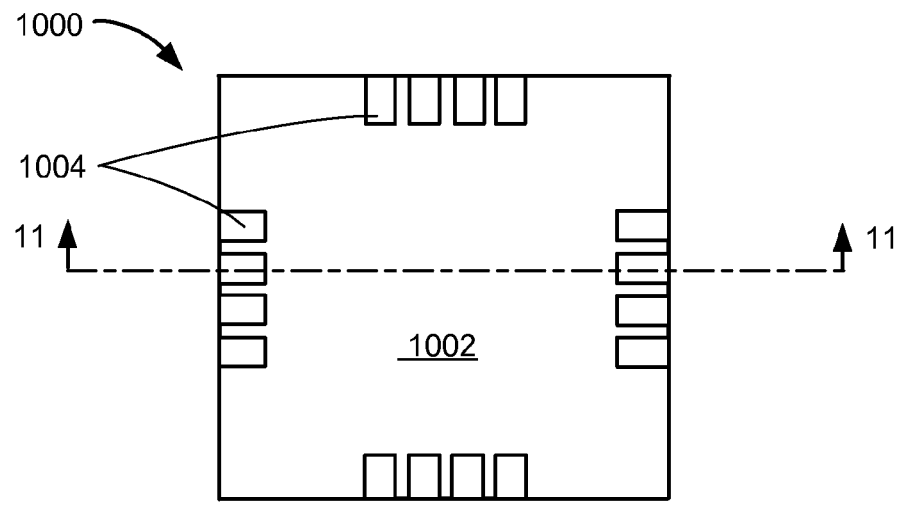
FIG. 10 is a bottom view of an integrated circuit package system in a sixth embodiment of the present invention.

Referring now to FIG. 10, therein is shown a bottom view of an integrated circuit package system 1000 in a sixth embodiment of the present invention. The bottom view shows a first encapsulation 1002, such as an epoxy molding compound, preferably surrounding and exposing a row of external interconnects 1004, such as leads.

For illustrative purposes, the external interconnects 1004 are shown in a single row configuration, although it is understood that the external interconnects 1004 may be in a different configuration, such as multiple rows. Also for illustrative purposes, a package side of the integrated circuit package system 1000 has the external interconnects 1004 equally spaced, although it is understood that the integrated circuit package system 1000 may have some sites depopulated such that the package side might not have the external interconnects 1004 equally spaced.

Figure 11:
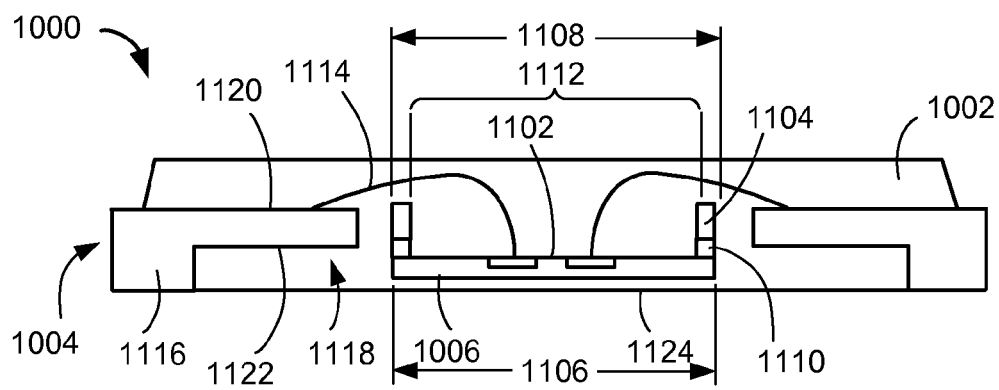
FIG. 11 is a cross-sectional view of the integrated circuit package system along line 11-11 of FIG. 10.

Referring now to FIG. 11, therein is shown a cross-sectional view of the integrated circuit package system 1000 along line 11-11 of FIG. 10. The cross-sectional view depicts an integrated circuit device 1006 having an active side 1102 mounted facing a paddle 1104. A device dimension 1106, such as a device width, of the integrated circuit device 1006 is preferably large enough to mount to the paddle 1104 or greater than a paddle dimension 1108, such as a paddle width. The active side 1102 may be mounted to the paddle 1104 with an adhesive 1110, such as a die-attach adhesive in a bump or column configuration.

The paddle 1104 preferably includes a hole 1112 located centrally in the paddle 1104. First internal interconnects 1114, such as bond wires, ribbon bond wires, or reverse stand-off stitch bonds (RSSB), connect the active side 1102 and the external interconnects 1004 through the hole 11 12. As discussed later herein, the hole 1112 preferably is centrally located in the paddle 1104 and may be in a variety of geometric configuration, such as a shape of a circle, a square, a rectangle, or a hexagon, for example.

Each of the external interconnects 1004 includes a body 1116 and a tip 1118, wherein the tip 1118 having a first tip side 1120 and a second tip side 1122 on an opposing side to the first tip side 1120. Preferably, the tip 1118 and the paddle 1104 are elevated above the body 1116. The first tip side 1120 may be coplanar with the paddle 1104.

The first encapsulation 1002, such as an epoxy molding compound, covers the integrated circuit device 1006, the first internal interconnects 1114, the paddle 1104, and the external interconnects 1004, with the external interconnects 1004 partially exposed. An inactive side 1124 on an opposing side of the active side 1102 of the integrated circuit device 1006 is also covered by the first encapsulation 1002.

Also, although the integrated circuit device 1006 is shown mounted under the paddle 1104 and electrically connected to the external interconnects 1004 through the hole 1112, it is understood that the integrated circuit device 1006 may be mounted over the paddle 1104 and electrically connected to the external interconnects 1004 through the hole 1112. It is also understood that although the active side 1102 is shown electrically connected to the external interconnects 1004 through the hole 1112, the active side 1102 may also be connected to the external interconnects 1004 without the first internal interconnects 1114 passing through the hole 1112.

It has been discovered that the present invention provides an integrated circuit package system with reduced profile by mounting an active side of an integrated circuit device, such as a an integrated circuit die or a flip chip, facing the paddle having the hole and the integrated circuit device mounts over or under the paddle. The internal interconnects, such as wires, electrically connect the integrated circuit device to the external interconnects through the hole in the paddle thereby minimizing the wire height above the paddle and thereby also minimizing the total package height. The routing of internal interconnects preferably through a hole of the paddle accommodates integrated circuit dice having centrally located bond pads, as well as bond pads on the periphery of the device. Moreover, the risk of inadvertent shorts is reduced from the wires in wire loop sweep during the molding process resulting in improved yield and lower cost.

It has also been discovered that the present invention maximizes or increases routing of additional wirings to electrically connect central portions of the integrated circuit device by having a hole in the die-attach paddle.

Figure 12:
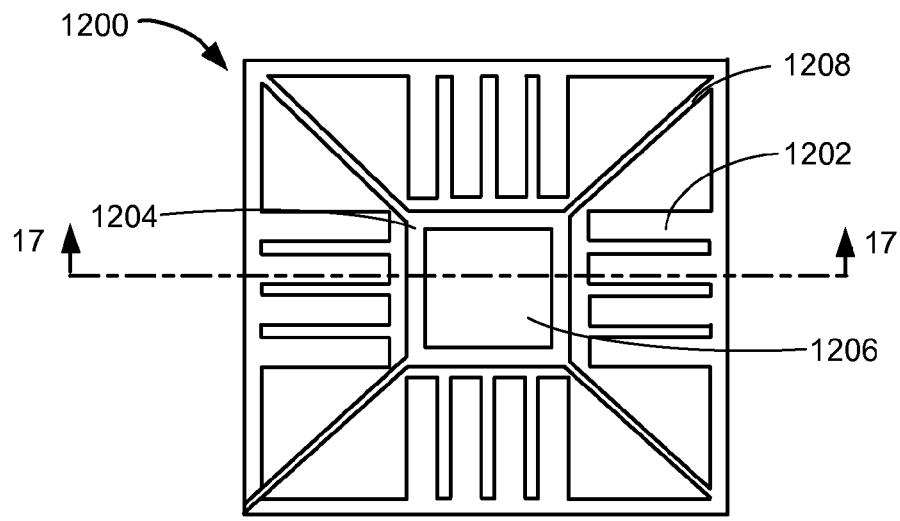
FIG. 12 is a top view of a lead frame in a seventh embodiment of the present invention.

Referring now to FIG. 12, therein is shown a top view of a lead frame 1200 in a seventh embodiment of the present invention. As discussed above, external interconnects 1202 and a paddle 1204 with a hole 1206 located centrally in the paddle 1204 form parts of the lead frame 1200, wherein the paddle 1204 and the hole 1206 may be a variety of geometric shape. For example, the paddle 1204 is formed in a geometric configuration with a perimeter portion a square geometric shape, and the hole 1206 also formed in a square geometric shape. The lead frame 1200 also includes tie bars 1208 connected to the paddle 1204. The lead frame 1200 may be used to form various embodiments of the present invention, such as the integrated circuit package system 100 of FIG. 1.

Figure 13:
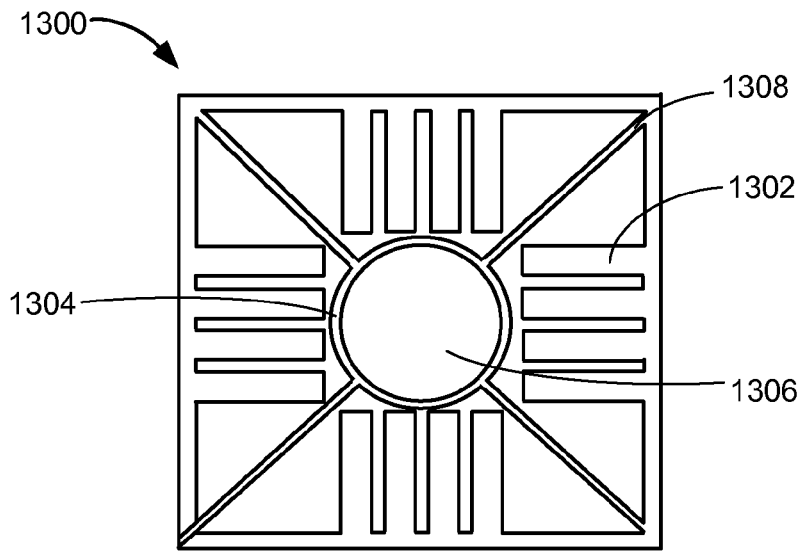
FIG. 13 is a top view of a lead frame in an eighth embodiment of the present invention.

Referring now to FIG. 13, therein is shown a top view of a lead frame 1300 in an eighth embodiment of the present invention. As discussed above, external interconnects 1302 and a paddle 1304 with a hole 1306 located centrally on the paddle 1304 form parts of the lead frame 1300, wherein the paddle 1304 and the hole 1306 may be a variety of geometric shape. For example, the paddle 1304 is formed in a geometric configuration with a perimeter portion a circular geometric shape, and the hole 1306 also formed in a circular geometric shape. The lead frame 1300 also includes tie bars 1308 connected to the paddle 1304. The lead frame 1300 may be used to form various embodiments of the present invention.

Figure 14:
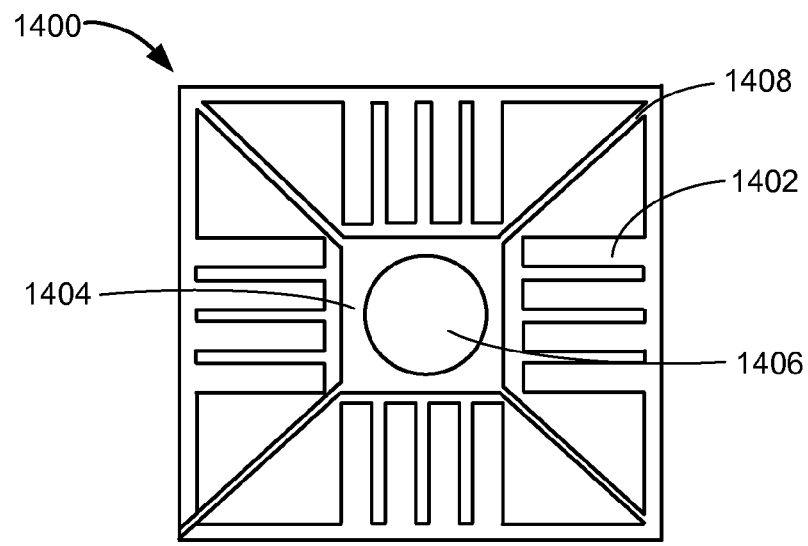
FIG. 14 is a top view of a lead frame in a ninth embodiment of the present invention.

Referring now to FIG. 14, therein is shown a top view of a lead frame 1400 in a ninth embodiment of the present invention. As discussed above, external interconnects 1402 and a paddle 1404 with a hole 1406 located centrally on the paddle 1404 form parts of the lead frame 1400, wherein the paddle 1404 and the hole 1406 may be a variety of geometric shape. For example, the paddle 1404 is formed in a geometric shape with a perimeter portion a square geometric shape, and the hole 1406 formed a circular geometric shape. The lead frame 1400 also includes tie bars 1408 connected to the paddle 1404. The lead frame 1400 may be used to form various embodiments of the present invention.

Figure 15:
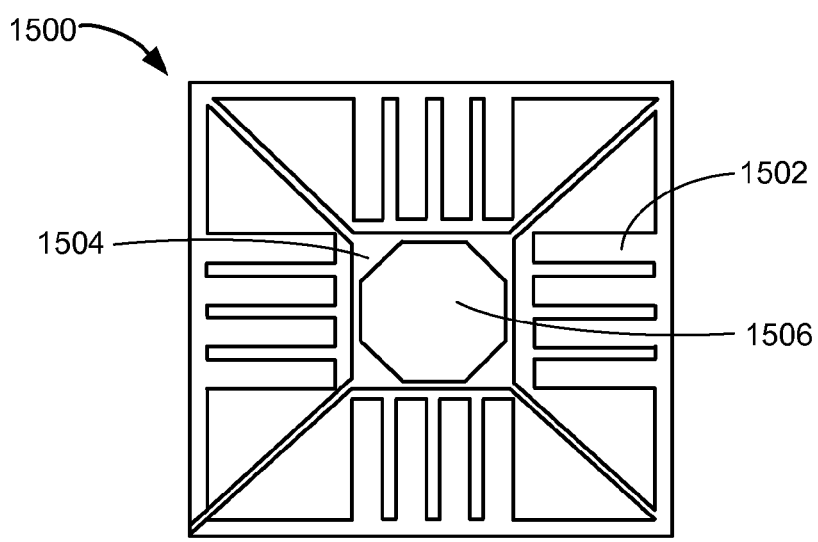
FIG. 15 is a top view of a lead frame in a tenth embodiment of the present invention.

Referring now to FIG. 15, therein is shown a top view of a lead frame 1500 in a tenth embodiment of the present invention. As discussed above, external interconnects 1502 and a paddle 1504 with a hole 1506 located centrally on the paddle 1504 form parts of the lead frame 1500, wherein the paddle 1504 and the hole 1506 may be a variety of geometric shape. For example, the paddle 1504 is formed in a geometric shape with a perimeter portion a square geometric shape, and the hole 1506 formed in a hexagonal geometric shape.

It is understood that many other variations in the geometric shapes of the paddle 1504 and the hole 1506 may be substituted without detracting from the scope of the present invention.

Figure 16:
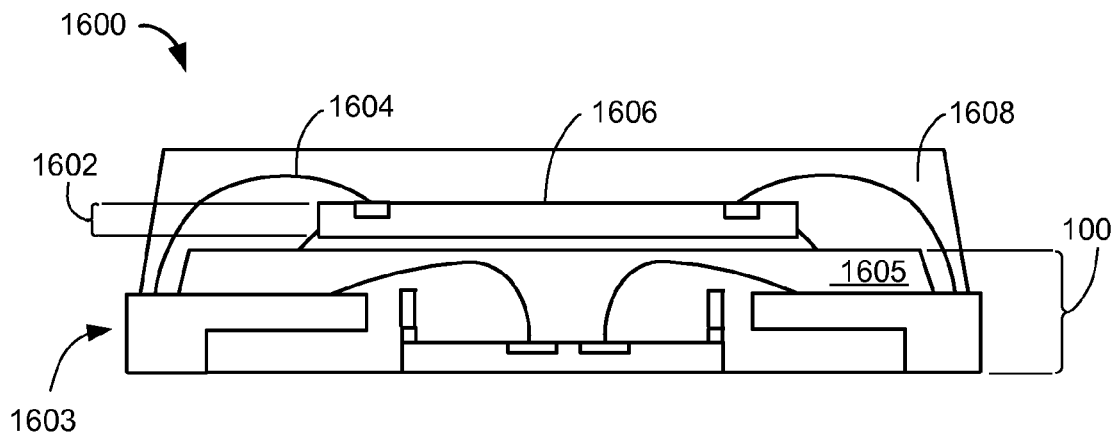
FIG. 16 is a cross-sectional view of an integrated circuit package system along line 2-2 having the bottom view as exemplified by FIG. 1 in a eleventh embodiment of the present invention.

Referring now to FIG. 16, therein is shown a cross-sectional view of an integrated circuit package system 1600 along line 2-2 of the bottom view as exemplified by FIG. 1 in a eleventh embodiment of the present invention. The cross-sectional view depicts an integrated circuit device structure 1602 is mounted over a first encapsulation 1605 of the integrated circuit package system 100. The integrated circuit device structure 1602 may be of any of a variety of types of integrated circuit device structures, such as an integrated circuit die, an integrated circuit package system having one or more integrated circuit dice, or a laminate having integrated circuit devices mounted thereon. Second internal interconnects 1604, such as bond wires, ribbon bond wires, or reverse stand-off stitch bonds (RSSB), preferably electrically connect a structure active side 1606 of the integrated circuit device structure 1602 to external interconnects 1603. A package encapsulation cover 1608, such as an epoxy molding compound, is then formed over the integrated circuit device structure 1602, the first encapsulation 1605, and the external interconnects 1603 with the external interconnects 1603 partially exposed. The integrated circuit package system 100 and the integrated circuit device structure 1602 may be tested before assembly of the integrated circuit package system 1600 ensuring known good units (KGU), increasing yield, and lowering manufacturing cost.

It has been discovered that the present invention provides an integrated circuit package system with stacked integrated circuit devices with reduced profile by mounting an active side of an integrated circuit device, such as a an integrated circuit die or a flip chip facing the paddle over the hole in the paddle. The low profile of the integrated circuit package system having the paddle with the hole provides a low profile for a package formed by stacking an integrated circuit device over the integrated circuit package system.

Figure 17:
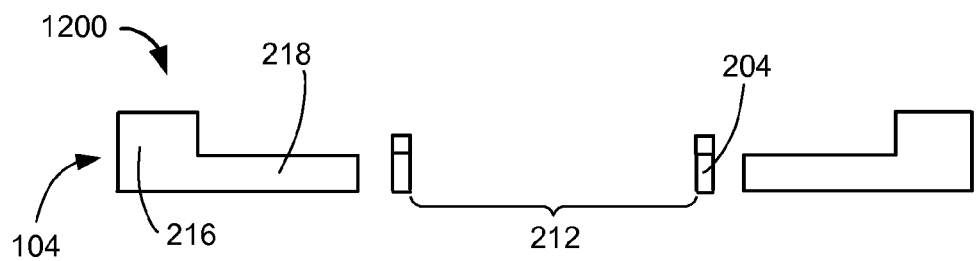
FIG. 17 is a cross-sectional view of the integrated circuit package system along line 17-17 of FIG. 12 in a forming phase of the external interconnects and the paddle.

Referring now to FIG. 17, therein is shown a cross-sectional view of the integrated circuit package system 100 of FIG. 2 in a forming phase of the external interconnects 104 and the paddle 204. The cross-sectional view depicts a portion of the lead frame 1200 along line 17-17 of FIG. 12. The paddle 204 is preferably between the external interconnects 104. The tip 218 and the paddle 204 may be formed in a number of ways. For example, the lead frame 1200 may be selectively partially etched forming the tip 218 and the paddle 204 below the height of the body 216.

The hole 212 of the paddle 204 may be formed in a number of ways. For example, the hole 212 may be punched through the paddle 204 or the lead frame 1200 may undergo additional selective etching of the paddle 204.

Figure 18:
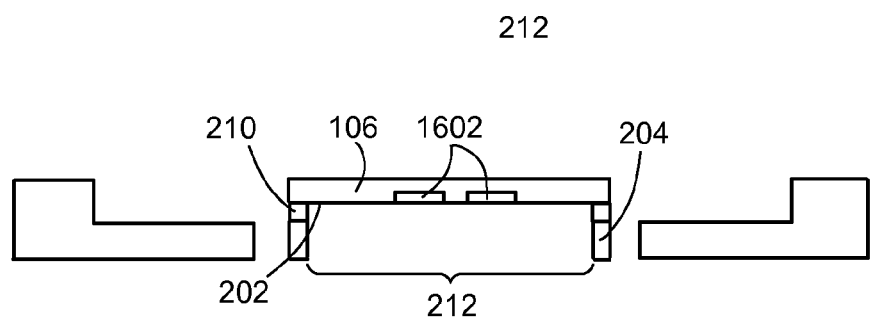
FIG. 18 is the structure of FIG. 17 in a mounting phase of the integrated circuit device.

Referring now to FIG. 18, therein is shown the structure of FIG. 17 in a mounting phase of the integrated circuit device 106. The integrated circuit device 106 mounts over the paddle 204 with the adhesive 210. The active side 202 faces the paddle 204 with the device pads 215 over the hole 212.

Figure 19:
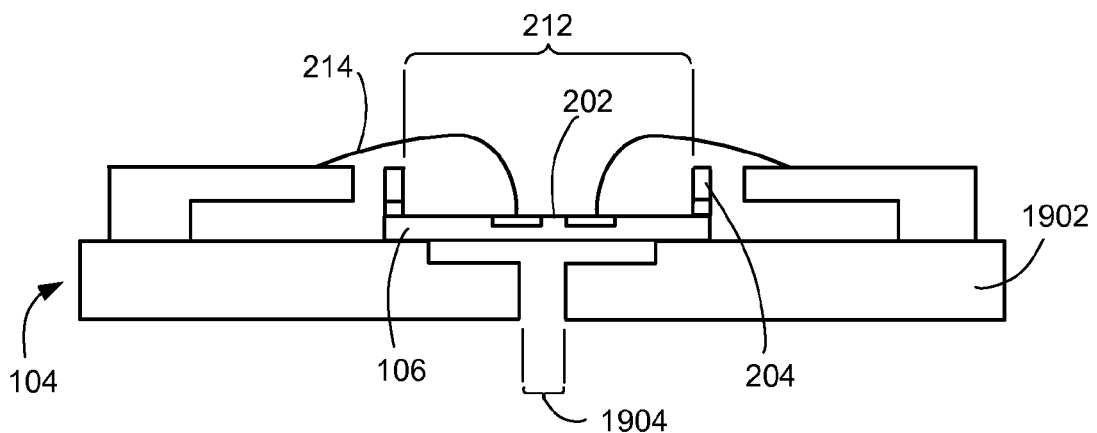
FIG. 19 is the structure of FIG. 18 in a connecting phase of the first internal interconnects.

Referring now to FIG. 19, therein is shown the structure of FIG. 18 in a connecting phase of the first internal interconnects 214. The external interconnects 104, the paddle 204, and the integrated circuit device 106 are in a vertically flipped orientation relative to the structure of FIG. 18. The structure of FIG. 19 is shown mounted on a holding structure 1902 with an opening 1904. A vacuum force through the opening 1904 preferably secures the structure of FIG. 19 for attaching the first internal interconnects 214. The first internal interconnects 214 electrically connect between the active side 202 to the external interconnects 104 through the hole 212.

Figure 20:
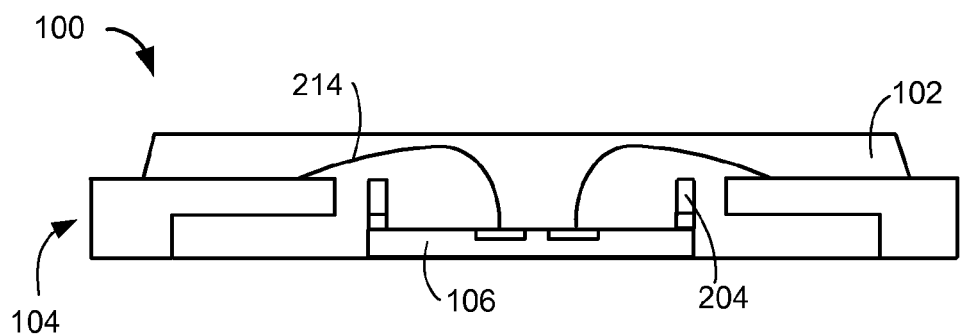
FIG. 20 is the structure of FIG. 19 in a forming phase of the first encapsulation.

Referring now to FIG. 20, therein is shown the structure of FIG. 19 in a forming phase of the first encapsulation 102. The first encapsulation 102 is preferably formed over the integrated circuit device 106, the paddle 204, the first internal interconnects 214, and the external interconnects 104, with the external interconnects 104 partially exposed. The structure of FIG. 20 undergoes a molding process forming the first encapsulation 102. The structure of FIG. 20 having the first encapsulation 102 may undergo a singulation process separating the integrated circuit package system 100 from the lead frame 1200 of FIG. 12 such as one of a variety of lead frames exemplified above, such as in FIG. 12 and partially exposing the external interconnects 104.

Figure 21:
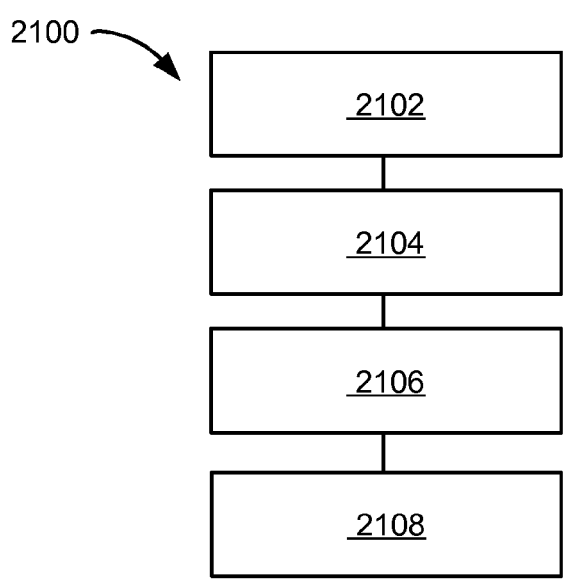
FIG. 21 is a flow chart of an integrated package system for manufacturing the integrated circuit package system in an embodiment of the present invention.

Referring now to FIG. 21, therein is shown a flow chart of an integrated circuit package system 2100 for manufacturing the integrated circuit package system 100 in an embodiment of the present invention. The system 2100 includes forming a paddle having a hole and an external interconnect in a block 2102; mounting an integrated circuit device having an active side to the paddle with the active side facing the paddle and the hole in a block 2104; connecting a first internal interconnect between the active side and the external interconnect through the hole in a block 2106; and encapsulating the integrated circuit device, the paddle, the first internal interconnect, and the external interconnect with the external interconnect partially exposed in a block 2108.

Yet another important aspect of the present invention is that it valuably supports and services the historical trend of reducing costs, simplifying systems, and increasing performance.

These and other valuable aspects of the present invention consequently further the state of the technology to at least the next level.

Thus, it has been discovered that the integrated circuit package system of the present invention furnishes important and heretofore unknown and unavailable solutions, capabilities, and functional aspects for improving yield, increasing reliability, and reducing cost of integrated circuit package system. The resulting processes and configurations are straightforward, cost-effective, uncomplicated, highly versatile, accurate, sensitive, and effective, and can be implemented by adapting known components for ready, efficient, and economical manufacturing, application, and utilization.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

What is claimed is:

1. A method of manufacturing an integrated circuit package comprising:

forming a paddle having four edge bars and a central cross bar resulting in the formation of two adjacent holes, wherein a first hole and a second hole are separated by the central cross bar and surrounded by the four edge bars;

forming a first external interconnect adjacent to the first hole;

forming a second external interconnect adjacent to the second hole;

mounting a first integrated circuit die to the paddle and the central cross bar, the first integrated circuit die having a first active side facing the first hole, wherein an edge of the first integrated circuit die aligns with a first outside edge of at least one of the four edge bars;

mounting a second integrated circuit die to the paddle and the central cross bar, the second integrated circuit die having a second active side facing the second hole, wherein an edge of the second integrated circuit die aligns with a second outside edge of at least one of the four edge bars;

connecting the first active side and the first external interconnect with a first internal interconnect through the first hole;

connecting the second active side and the second external interconnect with a second internal interconnect through the second hole; and encapsulating the first integrated circuit die, the second integrated circuit die, the paddle, the first internal interconnect, the second internal interconnect, the first external interconnect, and the second external interconnect with an encapsulation leaving a portion of the bottom surfaces of the first integrated circuit die, the second integrated circuit die, the first external interconnect, and the second external interconnect partially exposed.

2. The method as claimed in claim 1 further comprising:

mounting an integrated circuit device structure over the encapsulation;

connecting the integrated circuit device structure and the at least one of the first external interconnect and the second external interconnect with a third internal interconnect; and forming a package encapsulation cover over the integrated circuit device structure, the encapsulation, and the third internal interconnect with a portion of the at least one of the first external interconnect and the second external interconnect partially exposed.

3. A method of manufacturing an integrated circuit package comprising:

forming a paddle having four edge bars and a central cross bar resulting in the formation of two adjacent holes, wherein a first hole and a second hole are separated by the central cross bar and surrounded by the four edge bars;

forming a first external interconnect adjacent to the first hole, the first external interconnect having a first body and a first tip, wherein the first tip and the first hole are elevated above the first body;

forming a second external interconnect adjacent to the second hole, the second external interconnect having a second body and a second tip, wherein the second tip and the second hole are elevated above the second body;

mounting a first integrated circuit die to the paddle and the central cross bar with a first adhesive, the first integrated circuit die having a first active side facing the first hole, wherein an edge of the first integrated circuit die aligns with a first outside edge of at least one of the four edge bars;

mounting a second integrated circuit die to the paddle and the central cross bar with a second adhesive, the second integrated circuit die having a second active side facing the second hole, wherein an edge of the second integrated circuit die aligns with a second outside edge of at least one of the four edge bars;

connecting the first active side of the first integrated circuit die and the first external interconnect with a first internal interconnect through the first hole;

connecting the second active side of the second integrated circuit die and the second external interconnect with a second internal interconnect through the second hole; and encapsulating the first integrated circuit die, the second integrated circuit die, the paddle, the first internal interconnect, the second internal interconnect, the first external interconnect, and the second external interconnect with an encapsulation leaving a portion of the bottom surfaces of the first integrated circuit die, the second integrated circuit die, the first external interconnect, and the second external interconnect partially exposed.

4. An integrated circuit package system comprising:

a paddle having four edge bars and a central cross bar configured to form two adjacent holes, wherein a first hole and a second hole are separated by the central cross bar and surrounded by the four edge bars;

a first external interconnect adjacent the first hole of the paddle a second external interconnect adjacent the second hole of the paddle;

a first integrated circuit die mounted to the paddle and the central cross bar, the first integrated circuit die having a first active side facing the first hole, wherein an edge of the first integrated circuit die is configured to be in alignment with a first outside edge of at least one of the four edge bars;

a second integrated circuit die mounted to the saddle and the central cross bar, the second integrated circuit die having a second active side facing the second hole, wherein an edge of the second integrated circuit die is configured to be in alignment with a second outside edge of at least one of the four edge bars;

a first internal interconnect between the first active side and the first external interconnect through the first hole;

a second internal interconnect between the second active side and the second external interconnect through the second hole; and an encapsulation over the first integrated circuit die, the second integrated circuit die, the paddle, the first internal interconnect, the second internal interconnect, the first external interconnect, and the second external interconnect with a portion of the bottom surfaces of the first integrated circuit die, the second integrated circuit die, the first external interconnect and the second external interconnect partially exposed.

5. The system as claimed in claim 4 further comprising:
an integrated circuit device structure mounted over the encapsulation;
a third internal interconnect between a structure active side of the integrated circuit device structure and at least one of the first external interconnect and the second external interconnect; and
a package encapsulation cover over the integrated circuit device structure, the encapsulation, and the third internal interconnect, with a portion of the at least one of the first external interconnect and the second external interconnect partially exposed.

6. The system as claimed in claim 4 wherein:
the first external interconnect includes a first body and a first tip, wherein the first tip and the first hole are elevated above the first body;
the second external interconnect includes a second body and a second tip, wherein the second tip and the second hole are elevated above the second body;
the first integrated circuit die is mounted to the paddle and the central cross bar with a first adhesive; and
the second integrated circuit die is mounted to the paddle and the central cross bar with a second adhesive.

\* \* \* \* \*

UNITED STATES PATENT AND TRADEMARK OFFICE
CERTIFICATE OF CORRECTION

PATENT NO. : 8,643,157 B2
APPLICATION NO. : 11/766771
DATED : February 4, 2014
INVENTOR(S) : Tay et al.

It is certified that error appears in the above-identified patent and that said Letters Patent is hereby corrected as shown below:

In the Specification:

Column 7, line 61, delete "Can be" and insert therefor --can be--

Column 8, line 9, delete "Such as" and insert therefor --such as--

In the Claims:

Column 15, claim 1, lines 47-50, delete:

"a portion of the bottom surfaces of the first integrated circuit die, the second integrated circuit die, the first external interconnect, and the second external interconnect partially exposed."

and insert therefor:

--a portion of the first external interconnect and the second external interconnect, and a bottom surfaces of the first integrated circuit die and the second integrated circuit die partially exposed.--

Column 15, claim 2, lines 61-63, after "interconnect", insert a --.-- and delete:

"with a portion of the at least one of the first external interconnect and the second external interconnect partially exposed."

Signed and Sealed this
Sixteenth Day of February, 2016

Michelle K. Lee
*Director of the United States Patent and Trademark Office*

Column 16, claim 3, lines 35-38, delete:

"a portion of the bottom surfaces of the first integrated circuit die, the second integrated circuit die, the first external interconnect, and the second external interconnect partially exposed"

and insert therefor:

--a portion of the first external interconnect and the second external interconnect, and a bottom surfaces of the first integrated circuit die and the second integrated circuit die partially exposed.--

Column 16, claim 4, line 54, delete "saddle" and insert therefor --paddle--

Column 17, claim 4, lines 2-5, delete:

"a portion of the bottom surfaces of the first integrated circuit die, the second integrated circuit die, the first external interconnect and the second external interconnect partially exposed."

and insert therefor:

--with an encapsulation leaving a portion of the first external interconnect and the second external interconnect, and a bottom surfaces of the first integrated circuit die and the second integrated circuit die partially exposed--

Column 17, claim 5, lines 15-17, delete:

"interconnect, with a portion of the at least one of the first external interconnect and the second external interconnect partially exposed."

and insert therefor:

--interconnect.--